United States Patent
Liang et al.

(10) Patent No.: US 9,133,017 B2
(45) Date of Patent: Sep. 15, 2015

(54) MEMS STRUCTURE WITH ADAPTABLE INTER-SUBSTRATE BOND

(71) Applicant: Taiwan Semiconductor Manufacturing Company, Ltd., Hsin-Chu (TW)

(72) Inventors: Kai-Chih Liang, Zhubei (TW); Jiou-Kang Lee, Zhu-Bei (TW); Chung-Hsien Lin, Hsinchu (TW); Te-Hao Lee, Taipei (TW); Chia-Hua Chu, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/296,729

(22) Filed: Jun. 5, 2014

(65) Prior Publication Data

US 2014/0353776 A1 Dec. 4, 2014

Related U.S. Application Data

(62) Division of application No. 13/691,281, filed on Nov. 30, 2012, now Pat. No. 8,748,205.

(51) Int. Cl.
*H01L 27/20* (2006.01)
*H01L 29/84* (2006.01)
*B81B 3/00* (2006.01)

(52) U.S. Cl.
CPC .............. *B81B 3/0078* (2013.01); *B81B 3/0021* (2013.01); *H01L 29/84* (2013.01); *B81B 2203/01* (2013.01); *B81B 2207/09* (2013.01)

(58) Field of Classification Search
CPC .............. H01L 41/0926; H01L 41/094; H01L 41/1136; H01L 2924/1461; H01H 37/5418; H01H 2237/004; H01H 59/0009; H01H 1/0036; G01P 15/0802; G01P 15/124
USPC .......................................... 257/254, 414, 415
See application file for complete search history.

(56) References Cited

U.S. PATENT DOCUMENTS

| 7,303,935 | B2 | 12/2007 | DeNatale et al. | |
|---|---|---|---|---|
| 2007/0259470 | A1* | 11/2007 | Quenzer et al. | 438/50 |
| 2012/0149152 | A1* | 6/2012 | Tsai et al. | 438/113 |
| 2013/0135056 | A1* | 5/2013 | Allegato et al. | 331/116 R |

* cited by examiner

*Primary Examiner* — Hoai V Pham
(74) *Attorney, Agent, or Firm* — Haynes and Boone, LLP (57) ABSTRACT

A MEMS structure incorporating multiple joined substrates and a method for forming the MEMS structure are disclosed. An exemplary MEMS structure includes a first substrate having a bottom surface and a second substrate having a top surface substantially parallel to the bottom surface of the first substrate. The bottom surface of the first substrate is connected to the top surface of the second substrate by an anchor, such that the anchor does not extend through either the bottom surface of the first substrate or the top surface of the second substrate. The MEMS structure may include a bonding layer in contact with the bottom surface of the first substrate, and shaped to at least partially envelop the anchor.

20 Claims, 10 Drawing Sheets

MEMS STRUCTURE WITH ADAPTABLE INTER-SUBSTRATE BOND

PRIORITY

This application is a divisional of U.S. application Ser. No. 13/691,281, filed Nov. 30, 2012, titled "MEMS Structure with Adaptable Inter-Substrate Bond", the entire disclosure of which is hereby incorporated by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs, and, for these advances to be realized, similar developments in device design are needed.

Concurrent with advances in functional density, developments in microelectromechanical systems (MEMS) devices have led to entirely new devices and structures at sizes far below what was previously attainable. MEMS devices can be constructed to perform a variety of tasks including power generation, light projection, force sensing, switching, and locomotion. Forming such devices may involve techniques rarely seen in conventional circuit design that may incorporate multiple substrates and a variety of novel processes and materials. Here too, progress depends on continuing developments in device design and manufacturing.

As merely one example, some MEMS devices incorporate multiple substrates. Depending on how the substrates are bonded, the attachment points and attaching structures may impose strict design rules. While existing techniques for bonding substrates and forming structures incorporating multiple substrates have been generally adequate, they have not been entirely satisfactory in all regards.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The present disclosure relates generally to a MEMS structure and, more particularly, to a structure incorporating more than one bonded substrate and to a method for forming the structure.

The following disclosure provides many different embodiments, or examples, to illustrate the concepts herein. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
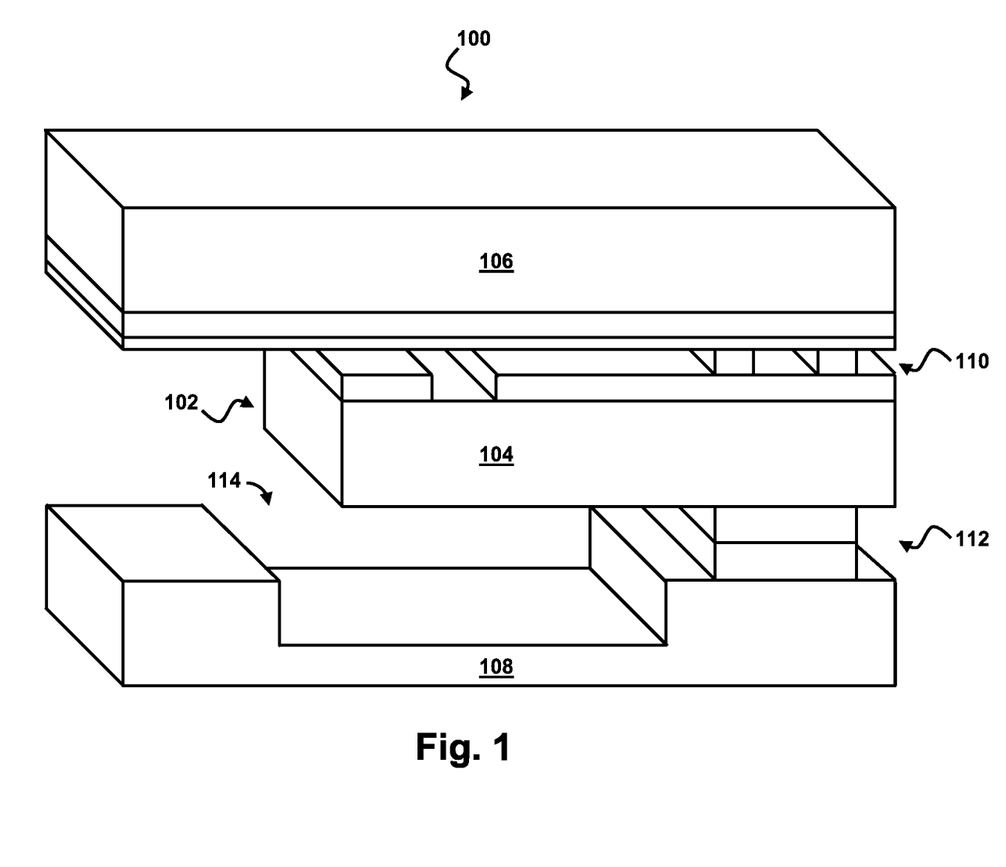
FIG. 1 is a perspective view of a section of a MEMS structure according to aspects of the present disclosure.

FIG. 1 is a perspective view of a section of a MEMS structure according to aspects of the present disclosure. FIG. 1 has been simplified for the sake of clarity. MEMS structure 100 is merely one example of a class of MEMS components where two or more substrates are joined. While the present disclosure deals generally in the context of a suspended beam structure, the principles disclosed herein apply equally to other MEMS structures incorporating joined substrates. Applications of these principles will be recognized by one of skill in the art, and such applications and structures are both contemplated and provided for.

MEMS structure 100 is typical of a component found in micro-accelerometers, micro-gyroscopes, pressure sensors, switches, resonators and other applications. In the illustrated embodiment, a suspended beam 102 or cantilever formed of a MEMS substrate 104 is attached to a carrier substrate 106 and a circuit substrate or capping substrate 108, which may include one or more metal routing layers. Anchors 110 and 112 (two types of which are illustrated) secure and support the substrates relative to each other. In some embodiments, the anchors are configured to allow the suspended beam 102 to flex in relation to the circuit substrate 108 and the carrier substrate 106. Flexion may occur in the surface plane of the circuit substrate 108, away from the surface plane of the substrate 108, and/or parallel to the substrate 108 surface. In some embodiments, a cavity 114 is formed in the circuit substrate 108 and/or the carrier substrate 106 to allow greater movement of the suspended beam 102. In some embodiments such as those incorporating a flexing beam 102, the anchors 110 and 112 are designed and configured to withstand the force and deformation caused by movement of the beam 102. Instead of sinking the anchors into the substrates, in some embodiments, the anchors are flush with the planar surfaces of the substrates. Such designs may avoid a substrate etching step as well as a CMP step. They may also avoid weakening the integrity of a substrate by etching, a known cause of electrical and structural failures. Because the substrate is not compromised, design rules may be relaxed leading to new anchor shapes and new MEMS structures. These advantages are merely exemplary, and no one advantage is associated with or required for any particular embodiment.

Figure 2:
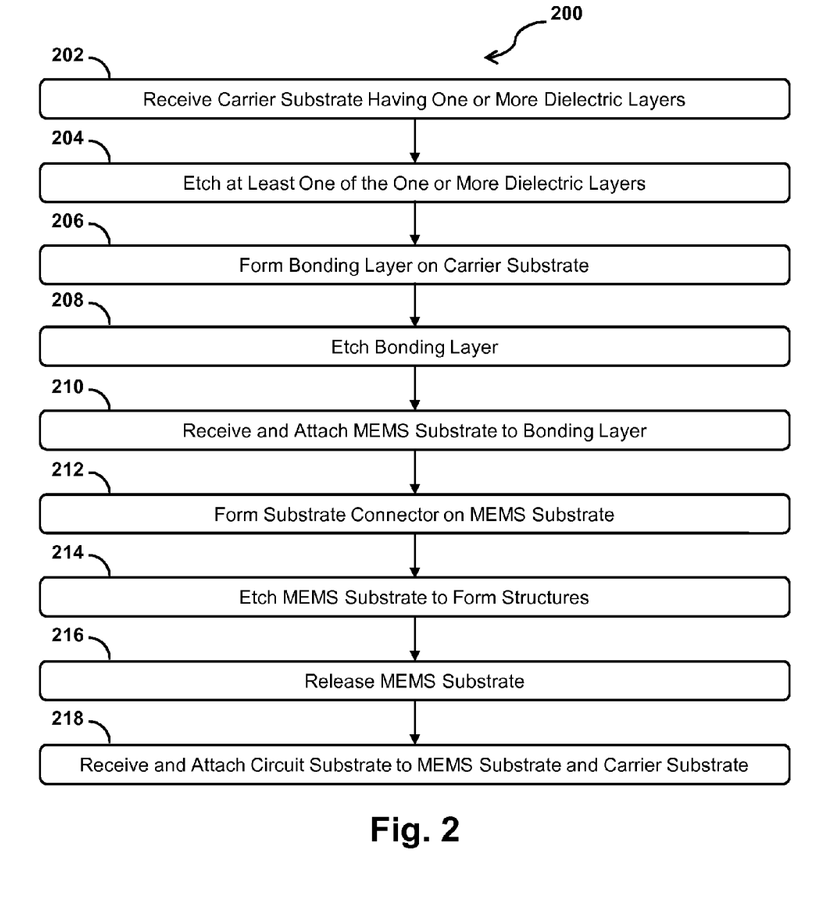
FIG. 2 is flow diagram of a method of forming a MEMS component according to aspects of the present disclosure.

A method of forming a MEMS component along with the component itself is disclosed with reference to FIGS. 2-10. FIG. 2 is a flow diagram of a method 200 of forming a MEMS component according to aspects of the present disclosure. It is understood that additional steps can be provided before, during, and after the method 200, and some of the steps described can be replaced or eliminated for other embodiments of the method. FIGS. 3-10 are cross-sectioned side view of a MEMS component 300 undergoing a method of formation according to aspects of the present disclosure.

Figure 3:
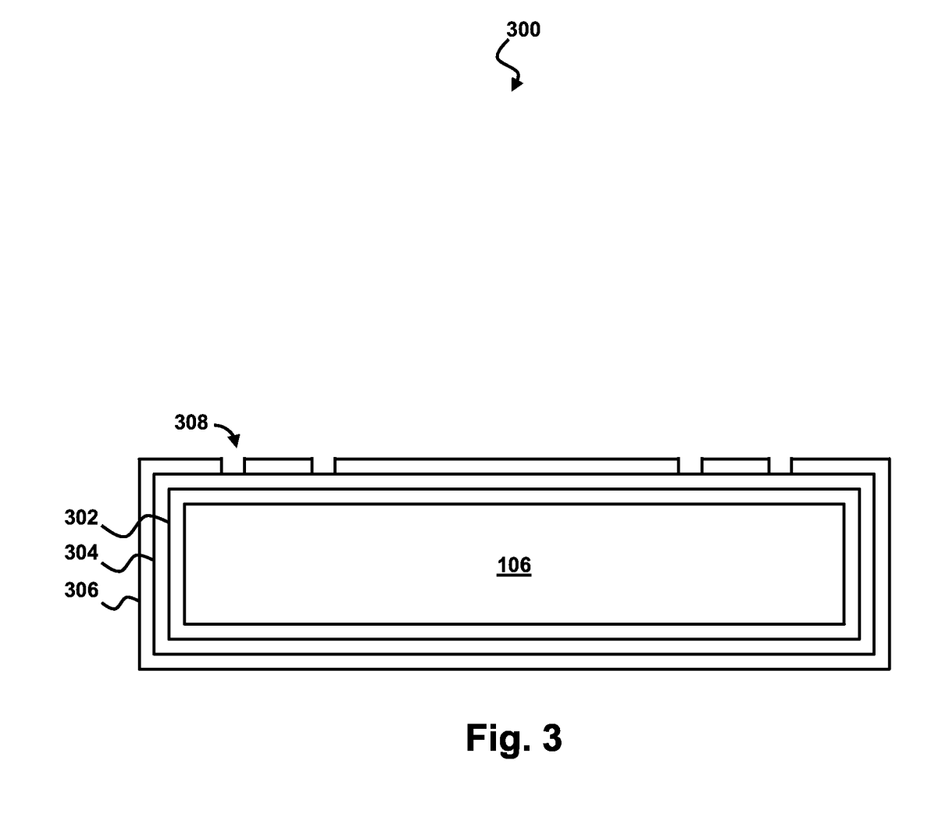
FIGS. 3-10 are cross-sectioned side view of a MEMS component undergoing a method of formation according to aspects of the present disclosure.

Referring to block 202 and FIG. 3, a carrier substrate 106 is received. The carrier substrate 106 is used to aid the processing of other wafers and may be selected based on mechanical rigidity, thermal compatibility, surface qualities, composition, and/or other qualities. The carrier substrate 106 may include an elementary semiconductor such as silicon or germanium and/or a compound semiconductor, such as silicon germanium, silicon carbide, gallium arsenic, indium arsenide, gallium nitride, and indium phosphide. Other exemplary materials include alloy semiconductors, such as silicon germanium carbide, gallium arsenic phosphide, and gallium indium phosphide. The carrier substrate 106 may have one or more layers defined within it. In some embodiments, the substrate layers include an epitaxial layer. In one such embodiment, the substrate contains an epitaxial layer overlying a bulk semiconductor. Other layered substrates include semiconductor-on-insulator (SOI) substrates. In one such SOI substrate, the substrate 106 includes a buried oxide (BOX) layer formed by a process such as separation by implanted oxygen (SIMOX). The carrier substrate 106 may include non-semiconductor materials including soda-lime glass, fused silica, fused quartz, calcium fluoride ($CaF_2$), and/or other suitable material.

While the carrier substrate 106 is typically understood as a support to be used during processing, in some embodiments, the carrier substrate 106 includes one or more active devices formed thereupon. Thus, the carrier substrate 106 may include doped regions, gate structures, isolation structures, interconnect layers, and other active device elements known to those of skill in the art.

The carrier substrate 106 may have one or more dielectric layers formed on the substrate 106. In the illustrated embodiment, the dielectric layers include an inner dielectric layer 302, a barrier dielectric layer 304, and a sacrificial dielectric layer 306. The dielectric layers may comprise an oxide material, such as silicon oxide; a nitrogen-containing material, such as silicon nitride or silicon oxynitride, an amorphous carbon material; silicon carbide; tetraethylorthosilicate (TEOS); other suitable materials; and/or combinations thereof. Common methods for forming the dielectric layers include spin-on deposition, physical vapor deposition (PVD), chemical vapor deposition (CVD), high-density plasma CVD (HDP-CVD), atomic layer deposition (ALD), and/or other suitable deposition processes. In an embodiment, the dielectric layers are selectively etchable. That is, it is possible to etch a first dielectric layer (e.g., the sacrificial dielectric layer 306) without etching a second layer (e.g., the barrier dielectric layer 304). Selective etchability may be achieved by selecting different materials for the dielectric layers. For example, buffered hydrofluoric acid can be used to selectively etch silicon oxide, whereas phosphoric acid can be used to selectively etch silicon nitride. Accordingly, in an embodiment, the inner dielectric layer 302 includes silicon oxide, the barrier dielectric layer 304 includes silicon nitride, and the sacrificial dielectric layer 306 includes silicon oxide. As another example, ashing removable dielectrics (ARDs) are more sensitive to ashing processes (e.g., $O_2$ ashing, $N_2$ ashing, or $H_2$ ashing) than other potential dielectrics. Thus, a dielectric layer may include an ARD. For the purposes of this disclosure, etching includes ashing processes. As yet another example, some dielectric materials can be selectively etched by controlling an etching process parameter such as etching time or concentration.

In block 204, one or more of the dielectric layers is etched. Etching may include a photolithographic patterning process, where a photoresist coating is applied to the substrate, exposed, and developed to uncover portions of the material to be etched. The photolithographic processes may include applying a photoresist coating (e.g., spin-on coating), soft baking, mask aligning, exposure, post-exposure baking, developing the photoresist, rinsing, and drying (e.g., hard baking). Alternatively, the photolithographic process may be implemented, supplemented, or replaced by other methods such as maskless photolithography, electron-beam writing, and ion-beam writing. After the resist is formed and shaped, one or more of the dielectric layers are etched using the exposed and developed photoresist. Suitable etching processes include dry etching, wet etching, and/or other etching methods (e.g., reactive ion etching). In the illustrated embodiment, the sacrificial dielectric layer 306 selectively etched. Some of the etched areas (e.g., etched recess 308) define anchors that will subsequently join the carrier substrate 106 to another substrate.

Figure 4:
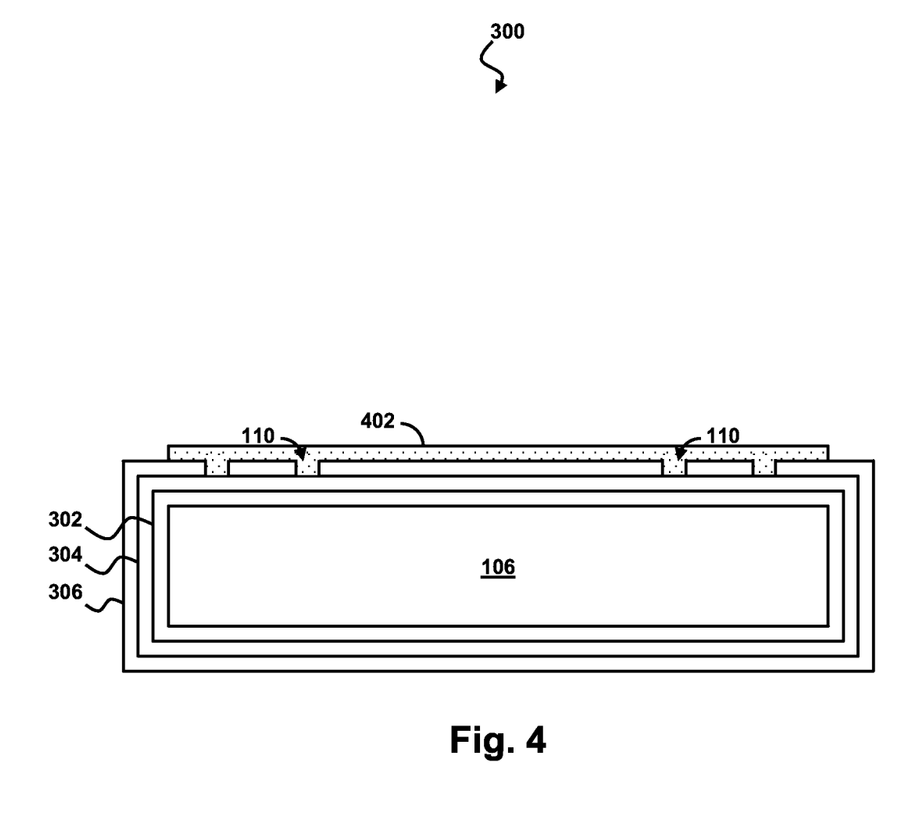

Referring to block 206 and FIG. 4, a bonding layer 402 is formed on the carrier substrate 106. Portions of the bonding layer 402, such as the portions formed in the etched recess 308, may define anchors 110. As the bonding layer 402 may be used in a subsequent fusion bond process, the materials used in the bonding layer 402 may be selected based on bonding properties as well as mechanical integrity. In embodiments where the anchors 110 electrically couple active devices formed on the carrier substrate 106 to devices on other substrates, the bonding layer material is selected based, in part, on conductivity. An exemplary material used in some embodiments is polycrystalline silicon (polysilicon) such as epitaxially-grown polysilicon (epi-poly). Therefore, in some embodiments, bonding layer 402 includes polysilicon. The bonding layer 402 may be formed by any suitable process and to any suitable thickness. Typical processes for forming the bonding layer 402 include vapor-phase epitaxy (VPE) using a feed gas such as silicon tetrachloride and a CVD process using a feed gas such as silane. Other suitable techniques include spin-on application, PVD, other CVD processes, HDP-CVD, and/or ALD. Forming the bonding layer 402 may include a chemical-mechanical polishing/planarization (CMP) process to create a suitable surface for fusion bonding. In an embodiment, a polysilicon bonding layer 402 is formed to an exemplary thickness of 4 μm over the outer dielectric layer (e.g., the sacrificial dielectric layer 306 in the illustrated embodiment) using a CVD process. As illustrated, the polysilicon bonding layer 402 may be deeper in regions corresponding to anchors 110.

Figure 5:
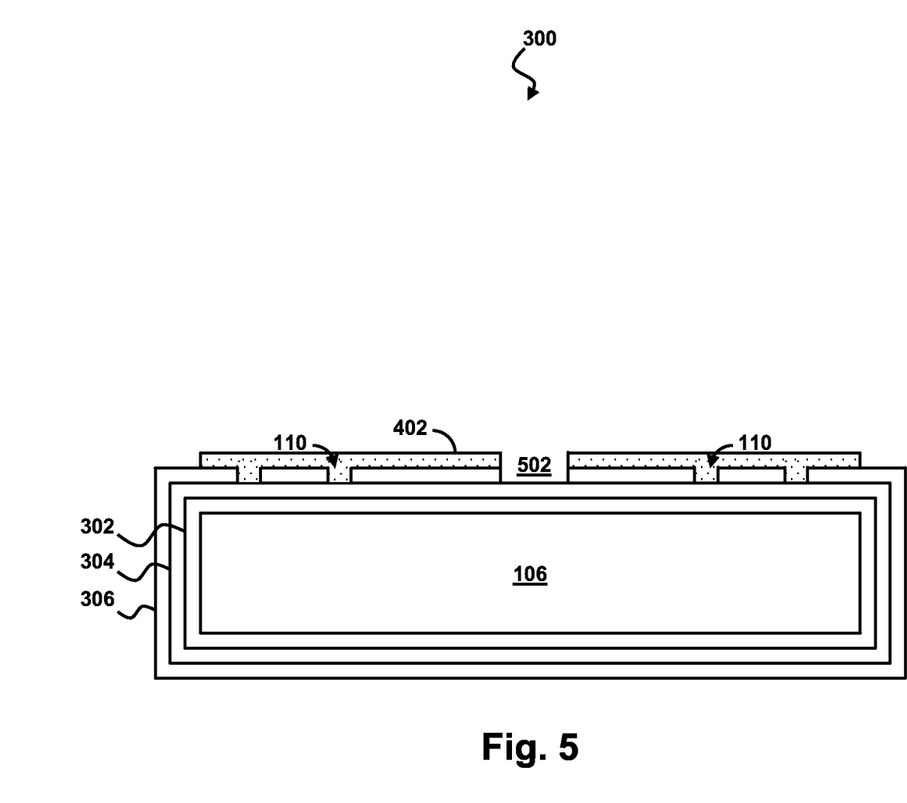

In block 208, referring to FIG. 5, etching may be performed on the bonding layer 402. In some embodiments, this includes etching one or more of the dielectric layers as well. Etching may include a photolithographic patterning process, which, in turn, may include applying a photoresist coating (e.g., spin-on coating), soft baking, mask aligning, exposure, post-exposure baking, developing the photoresist, rinsing, and drying (e.g., hard baking). Alternatively, the photolithographic process may be implemented, supplemented, or replaced by other methods such as maskless photolithography, electron-beam writing, and ion-beam writing. After the resist is formed and shaped, the bonding layer 402 and, in some embodiments, one or more of the dielectric layers are etched to using the exposed and developed photoresist. Suitable etching processes include dry etching, wet etching, and/or other etching methods (e.g., reactive ion etching). In the illustrated embodiment, the etching process forms recesses 502. The recesses 502 may be used to control the stiffness and/or degree of flexibility of a suspended structure. The recesses 502 may also define MEMS structures such as a cantilever stopper (e.g., cantilever stopper 906 illustrated in FIG. 9) and/or anti-stiction structures.

Figure 6:
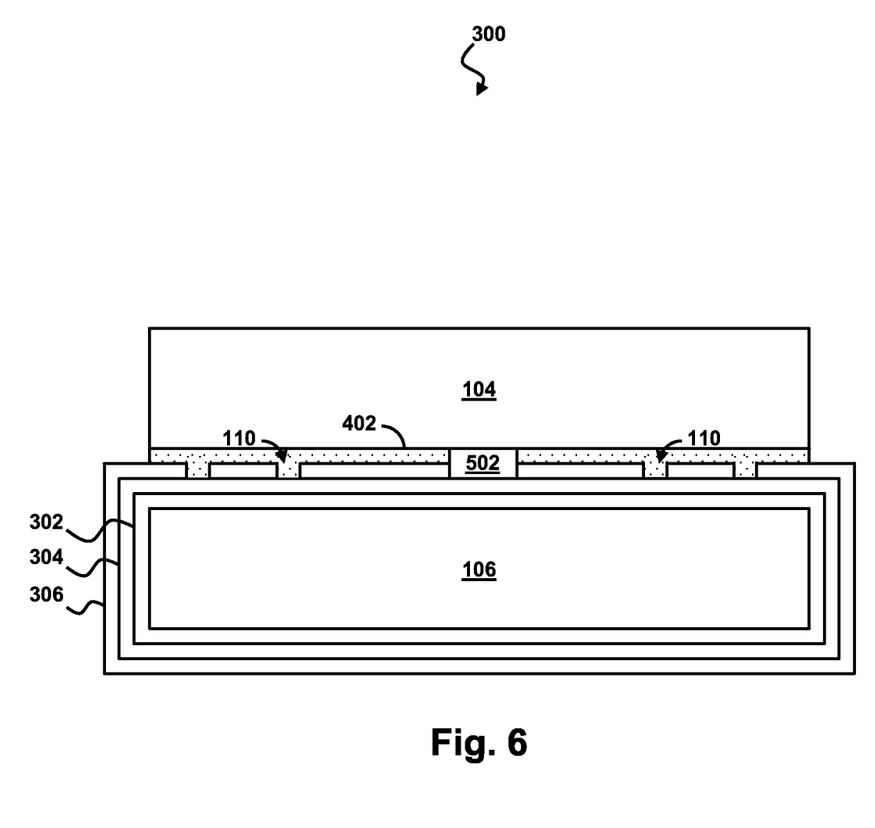

Referring to block 210 and FIG. 6, a MEMS substrate is attached to the bonding layer 402 opposite the carrier substrate 106. The MEMS substrate 104 may include an elementary semiconductor such as silicon or germanium and/or a compound semiconductor, such as silicon germanium, silicon carbide, gallium arsenic, indium arsenide, gallium nitride, and indium phosphide. Other exemplary materials include alloy semiconductors, such as silicon germanium carbide, gallium arsenic phosphide, and gallium indium phosphide. The MEMS substrate 104 may have one or more layers defined within it. In some embodiments, the substrate layers include an epitaxial layer. In one such embodiment, the substrate contains an epitaxial layer overlying a bulk semiconductor. Other layered substrates include semiconductor-on-insulator (SOI) substrates. In one such SOI substrate, the MEMS substrate 104 includes a buried oxide (BOX) layer formed by a process such as separation by implanted oxygen (SIMOX). In some embodiments, the MEMS substrate includes metal such as aluminum, copper, titanium, tantulum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof. Exemplary metal structures within a MEMS substrate 104 include metal traces, metal contacts, and metal layers.

The MEMS substrate 104 is attached to the bonding layer 402 by a process such as fusion bonding. Fusion bonding utilizes temperature and pressure to join semiconductor materials. For example, in a room-temperature bonding process, a bonder device forces the MEMS substrate 104 and the carrier substrate 106 together. This is followed by an annealing process to increase the bond strength. In another bonding process, a fusion bonder applies a plasma treatment to the substrates, aligns the substrates, and then applies force to bond the substrates. This may also be followed by an annealing process. In some exemplary embodiments, a polysilicon bonding layer 402 is fusion bonded to a silicon, a germanium, or a silicon germanium compound MEMS substrate 104.

Figure 7:
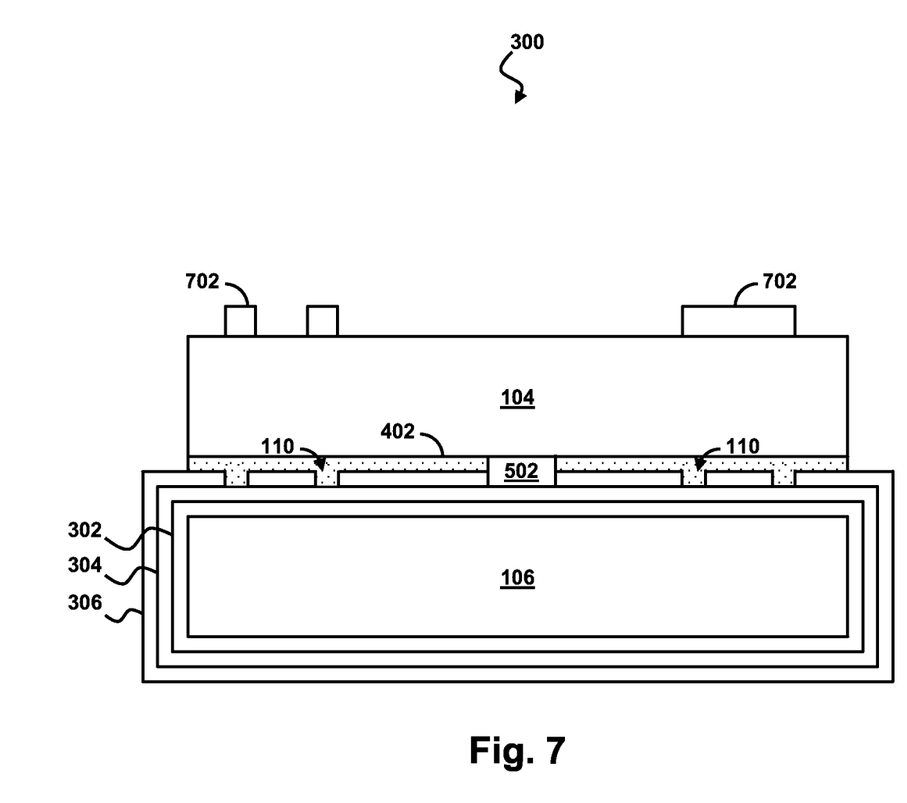

Referring to block 212 and FIG. 7, a second type of anchor 112 is begun by forming a substrate connector 702 on the MEMS substrate 104. As an anchor, the substrate connector 702 is intended to join one or more substrates, and therefore suitable materials may be selected based on their rigidity and resilience to stress caused by movement of the MEMS substrate. In some embodiments, the substrate connector 702 electrically couples the substrates, and suitable materials may be further selected based on their conductivity. As yet a further consideration, in some embodiments, the substrate connector 702 is part of a eutectic bond, and the materials for the substrate connector 702 are selected based on their ability to form a eutectic system. Eutectic bonding materials form alloys at temperatures less than the melting points of the pure components. When the bonding materials are properly selected, eutectic bonding has the advantage of forming an anchor 112 with a predictable shape and without melting components elsewhere on the device. Suitable eutectic materials include copper, gold, and aluminum in compounds such as AlCu, AlCu/TiN, and/or AlCu/Ge. Other suitable materials will be recognized by one of skill in the art. The selected material or materials are applied to the MEMS substrate 104 and shaped to form the substrate connector 702. In some embodiments, the substrate connector 702 is formed by deposition of the material through a process such as PVD, CVD, HDP-CVD, electroplating, sputtering, and/or other deposition process, followed by a photolithographic process and an etching of unused material. The remaining material forms the substrate connector 702.

Figure 8:
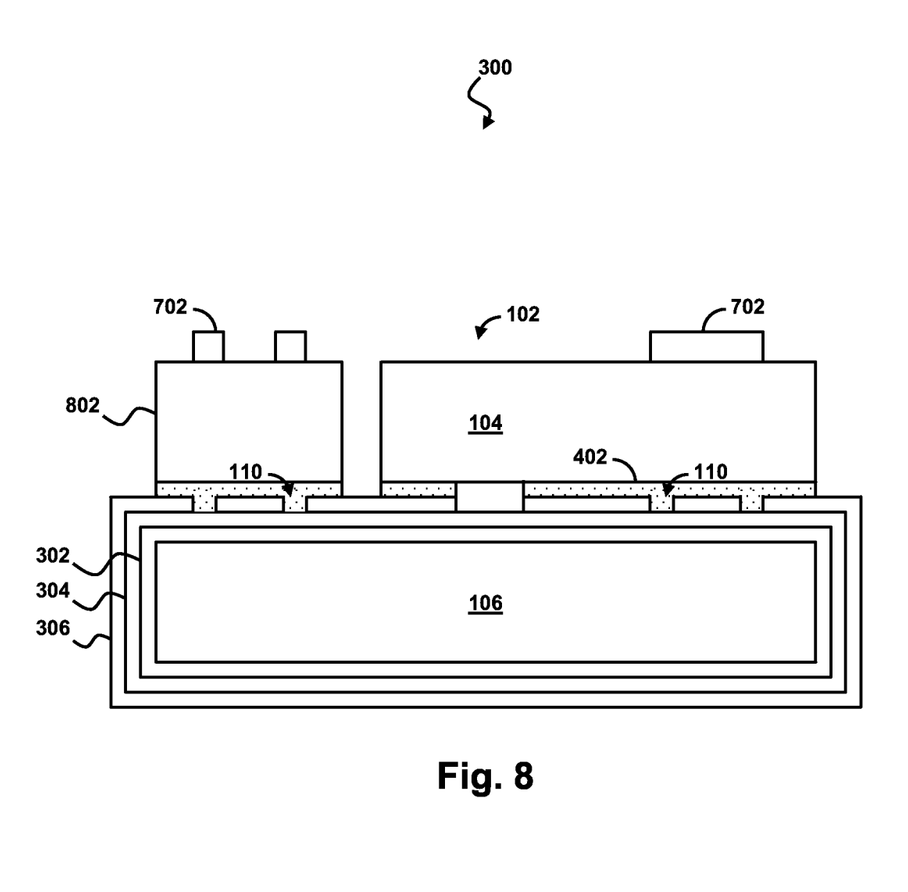

Referring to block 214 and FIG. 8, the MEMS substrate 104 may be etched to form structures such as a suspended beam 102 and a support column 802. It is understood that these are merely examples, and that other types of MEMS structures are both contemplated and provided for. Etching is commonly preceded by a photolithographic process that protects areas of the MEMS substrate 104 that are not intended to be etched. The photolithographic processes may include applying a photoresist coating (e.g., spin-on coating), soft baking, mask aligning, exposure, post-exposure baking, developing the photoresist, rinsing, drying (e.g., hard baking), other suitable processes, and/or combinations thereof. The masking element is then used to etch the MEMS substrate. Alternatively, the photolithographic process is implemented or replaced by other proper methods such as maskless photolithography, electron-beam writing, and ion-beam writing. The etching processes may include dry etching, wet etching, and/or other etching methods (e.g., reactive ion etching). It will be recognized by one of skill in the art that some steps of the method 200 may be performed in alternate orders. For example, in some embodiments, the MEMS substrate 104 is etched as disclosed in block 214 prior to forming the substrate connector 702 as disclosed in block 212.

Figure 9:
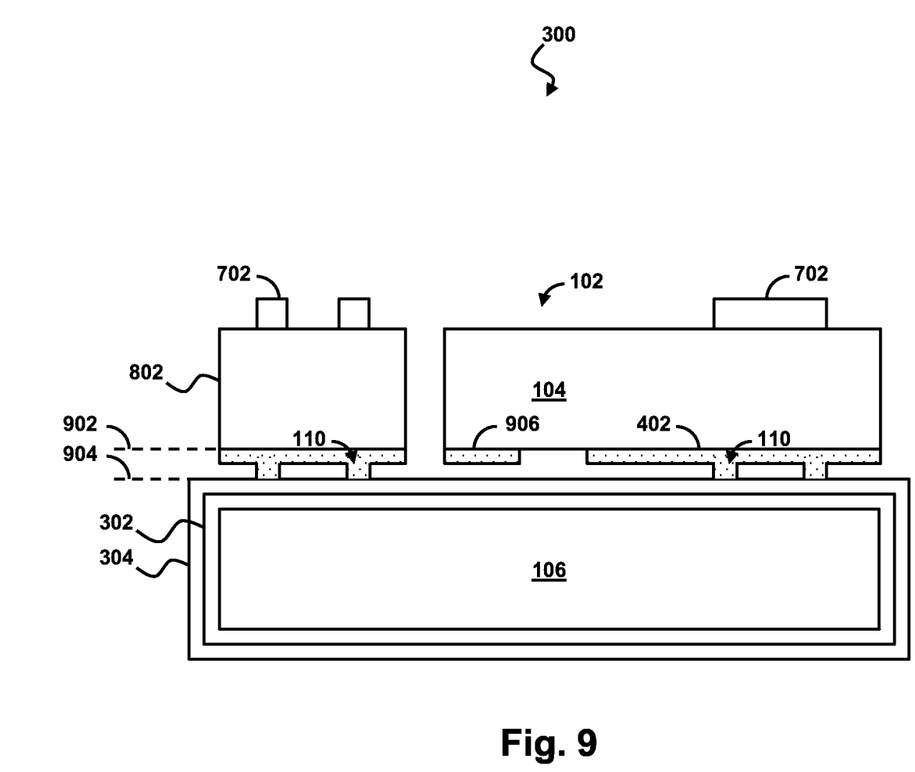

Referring to block 216 and FIG. 9, the MEMS substrate 104 is released from the carrier substrate 106. This may be performed by selectively etching one or more of the dielectric layers formed on the carrier substrate 106. In an embodiment, this includes selectively etching the sacrificial layer 306. In some embodiments, the selective etching leaves certain structures unetched, such as anchors 110 and/or cantilever stopper 906. As can be seen, releasing the MEMS substrate 104 does not necessarily disconnect the MEMS substrate 104 from the from the carrier substrate 106. The substrates remain connected via the anchors 110.

Referring to FIG. 9, the inter-substrate anchors 110 can be identified and described. In contrast to designs where anchor structures extend into the joined substrates, the anchors 110 extend from a bottom planar surface 902 of a first substrate to a top planar surface 904 of a second substrate, surfaces 902 and 904 being substantially parallel. The anchors 110 terminate at the planar surfaces 902 and 904 without extending into the substrates. In some embodiments, this eliminates a substrate-etching step that may weaken the substrate or cause electrical failures. In some embodiments, this allows greater freedom in anchor shape and placement. The anchors 110 may be formed as part of the bonding layer 402 such that the bonding layer 402 partially envelops the anchors 110. Forming the anchors 110 as part of the bonding layer 402 may add greater structural integrity and further strengthen the bond.

Figure 10:
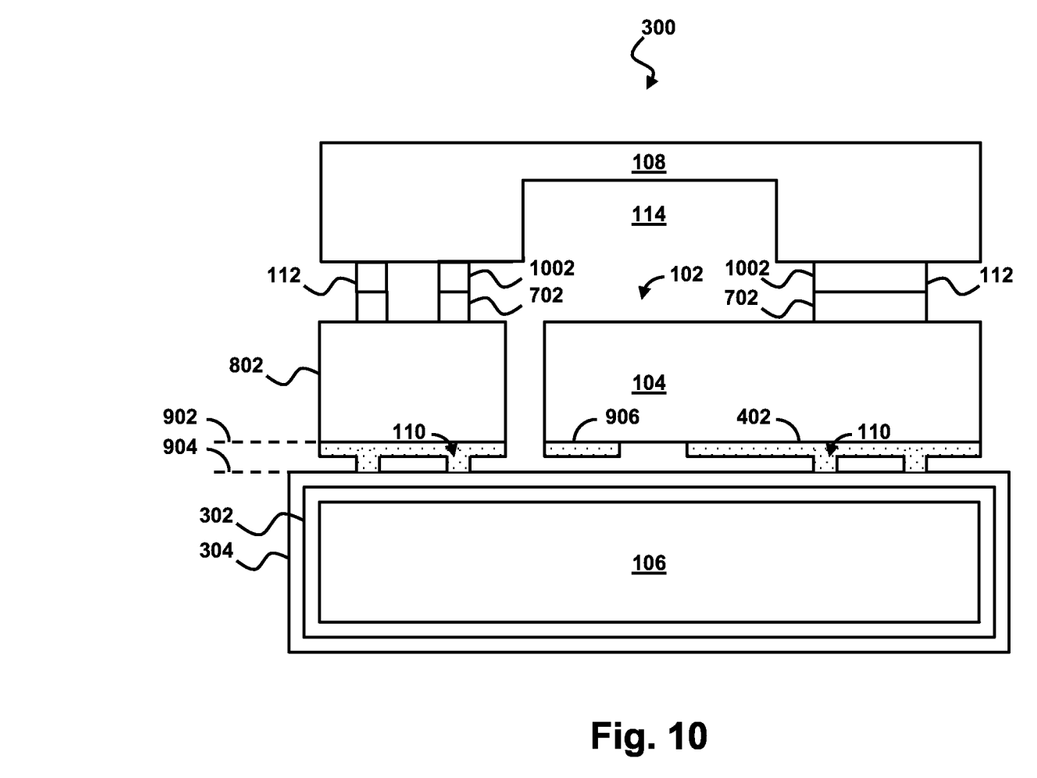

Referring block 218 and FIG. 10, the MEMS substrate 104 and the carrier substrate 106 are attached to a circuit substrate (or capping substrate) 108. The circuit substrate 108 may include an elementary semiconductor such as silicon or germanium and/or a compound semiconductor, such as silicon germanium, silicon carbide, gallium arsenic, indium arsenide, gallium nitride, and indium phosphide. Other exemplary materials include alloy semiconductors, such as silicon germanium carbide, gallium arsenic phosphide, and gallium indium phosphide. The circuit substrate 108 may have one or more layers defined within it. In some embodiments, the substrate layers include an epitaxial layer. In one such embodiment, the substrate contains an epitaxial layer overlying a bulk semiconductor. Other layered substrates include semiconductor-on-insulator (SOI) substrates. In one such SOI substrate, the circuit substrate 108 includes a buried oxide (BOX) layer formed by a process such as separation by implanted oxygen (SIMOX). The circuit substrate 108 may include non-semiconductor materials including soda-lime glass, fused silica, fused quartz, calcium fluoride ($CaF_2$), and/or other suitable material.

In various embodiments, the circuit substrate 108 has one or more active devices formed on the circuit substrate 108. Thus, the substrate 108 may include various doped regions depending on design requirements as known in the art (e.g., p-type wells or n-type wells). The doped regions may be doped with p-type dopants, such as phosphorus or arsenic, and/or n-type dopants, such as boron or $BF_2$. The doped regions may be formed directly on the substrate, in a P-well structure, in a N-well structure, in a dual-well structure, or using a raised structure. The semiconductor substrate may further include various active regions, such as regions configured for an N-type metal-oxide-semiconductor transistor device (referred to as an NMOS) and regions configured for a P-type metal-oxide-semiconductor transistor device (referred to as a PMOS). It is understood that the active devices may be formed by CMOS technology processing, and thus some processes are not described in detail herein. In addition to the active devices, the circuit substrate 108 may include one or more interconnect layer containing conductive traces linking the active devices.

The circuit substrate 108 may be shaped to accommodate movement of one or more portions of the MEMS substrate 104. For example, in some embodiments, the circuit substrate 108 includes a cavity 114 aligned to allow greater movement of a suspended beam 102. In some embodiments, the circuit substrate 108 includes a cavity 114 configured to control the atmosphere surrounding a portion of the MEMS substrate 104. In one such embodiment, the cavity 114 maintains a partial vacuum surrounding a suspended beam 102. In another such embodiment, the cavity 114 maintains a particular gas composition surrounding a suspended beam 102. In some embodiments, the cavity 114 defines a chamber opened to a pressure sensor formed on the MEMS substrate 104.

In the illustrated embodiment of FIG. 10, the circuit substrate includes a complementary substrate connector 1002. Such a connector 1002 may be formed from a material chosen to form a eutectic bond with the substrate connector 702. Examples include Ge, AlCu, AlCu/TiN, and/or AlCu/Ge. Accordingly, in one such embodiment, the attaching of block 218 includes a eutectic bonding process joining the MEMS substrate 104 to a circuit substrate 108. In another embodiment lacking the complementary substrate connector 702, the attaching of block 218 includes a eutectic bonding process joining substrate connector 702 to a material of the circuit substrate 108. As a further example of a reordering of the steps of the method 200, in some embodiments, the MEMS substrate 104 is released from the carrier substrate 106 as disclosed in block 216 after the bonding disclosed in block 218.

Thus, the present disclosure provides a MEMS structure incorporating joined substrates and a method for forming the structure. In some exemplary embodiments, the MEMS device comprises: a first substrate having a bottom surface; and a second substrate having a top surface substantially parallel to the bottom surface of the first substrate, wherein the bottom surface of the first substrate is connected to the top surface of the second substrate by an anchor, and wherein the anchor does not extend through either the bottom surface of the first substrate or the top surface of the second substrate. In some such embodiments, the device further comprises a bonding layer contacting the bottom surface of the first substrate, wherein the bonding layer at least partially envelops the anchor. In one such embodiment, each of the anchor and the bonding layer includes polysilicon. In some such embodiments, the anchor defines a suspended portion of the first substrate. In one such embodiment, the suspended portion of the first substrate is cantilevered. In some such embodiments, the first substrate further has a top surface opposite the bottom surface, the circuit device further comprises a third substrate having a bottom surface substantially parallel to the top surface of the first substrate, and the bottom surface of the third substrate is connected to the top surface of the first substrate via a second anchor. In one such embodiment, the second anchor includes a eutectic bonding material.

In further exemplary embodiments, a method for forming a MEMS device comprises: receiving a first substrate; receiving a second substrate having one or more dielectric layers; etching at least one of the one or more dielectric layers to define a recess; forming a bonding layer on the one or more dielectric layers, wherein the forming of the bonding layer includes forming an anchor defined by the recess; joining the first substrate to the bonding layer; and removing at least one of the one or more dielectric layers to release a portion of the first substrate. In one such embodiment, the method further comprises etching the first substrate to define a suspended structure; and the removing of the at least one of the one or more dielectric layers releases a portion of the suspended structure. In a further such embodiment, the joining of the first substrate includes forming a fusion bond between the bonding layer and the first substrate. In some such embodiments, the method further comprises forming a substrate connector on the first substrate and joining a third substrate to the first substrate via the substrate connector. In one such embodiment, the joining of the third substrate includes performing a eutectic bonding procedure to join the substrate connector to the third substrate. In another such embodiment, the method further comprises etching the bonding layer prior to the joining of the first substrate to the boding layer. In a further such embodiment, the etching defines a stopper contacting the released portion of the second substrate.

In yet further exemplary embodiments, the method for forming a MEMS device comprises: receiving a first substrate having a bottom surface and a second substrate having a top surface; and joining the bottom surface of the first substrate to the top surface of the second substrate via an anchor such that the bottom surface of the first substrate and the top surface of the second substrate are substantially parallel, wherein the joining includes: etching a sacrificial layer of the second substrate to form an etched recess; forming the anchor at least partially within the etched recess, wherein the anchor does not extend through either the bottom surface of the first substrate or the top surface of the second substrate; and removing the sacrificial layer. In some such embodiments, the removing of the sacrificial layer creates a suspended region of the first substrate. In one such embodiment, the suspended region of the first substrate is cantilevered. In some such embodiments, the joining further includes fusion bonding the first substrate to the anchor. In one such embodiment, the method further comprises forming a substrate connector on the first substrate; and joining a third substrate to the first substrate via the substrate connector. In a further such embodiment, the joining of the third substrate includes performing a eutectic bonding procedure to join the substrate connector to the third substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A MEMS device comprising:
a first substrate having a bottom surface;
a second substrate coupled to the first substrate and having a top surface substantially parallel to the bottom surface of the first substrate,
wherein the bottom surface of the first substrate is connected to the top surface of the second substrate by a first anchor, and
wherein the first anchor does not extend through either the bottom surface of the first substrate or the top surface of the second substrate; and
a third substrate coupled to the first substrate by a second anchor such that a portion of the first substrate extends beyond the first anchor and the second anchor and is suspended between the second substrate and the third substrate.

2. The device of claim 1, further comprising a bonding layer contacting the bottom surface of the first substrate, wherein the bonding layer at least partially envelops the anchor.

3. The device of claim 2, wherein each of the first anchor and the bonding layer includes polysilicon.

4. The device of claim 1, wherein the suspended portion of the first substrate is cantilevered.

5. The device of claim 1,
wherein the first substrate further has a top surface opposite the bottom surface;
wherein the third substrate has a bottom surface substantially parallel to the top surface of the first substrate; and
wherein the bottom surface of the third substrate is connected to the top surface of the first substrate via the second anchor.

6. The device of claim 5, wherein the second anchor includes a eutectic bonding material.

7. The device of claim 1, wherein the second substrate and the third substrate define a cavity surrounding the suspended portion of the first substrate.

8. The device of claim 7, wherein the cavity is sealed to maintain a vacuum surrounding the suspended portion of the first substrate.

9. A device comprising:
a first substrate including a dielectric layer having a first surface;
a second substrate including a second surface disposed towards the first surface of the dielectric layer;
an anchor structure extending between and coupling the first surface of the dielectric layer to the second surface of the second substrate, wherein the anchor structure does not extend into the first substrate and does not extend into the second substrate; and
a third substrate coupled to the second substrate by a eutectic material formed on the third substrate and a complementary eutectic material formed on the second substrate.

10. The device of claim 9, wherein the anchor structure includes polysilicon.

11. The device of claim 9, wherein a portion of the second substrate is cantilevered beyond the anchor structure.

12. The device of claim 11, wherein the anchor structure is configured to permit the cantilevered portion of the second substrate to move relative to first substrate.

13. The device of claim 11, wherein the third substrate defines a cavity surrounding the cantilevered portion of the second substrate.

14. The device of claim 13, wherein the cavity is configured to maintain a partial vacuum surrounding the cantilevered portion of the second substrate.

15. The device of claim 9, wherein the anchor structure is bonded to a semiconductor material of the second surface of the second substrate.

16. A device comprising:
a first substrate;
a second substrate coupled to the first substrate by a first anchor;
a third substrate coupled to the first substrate by a second anchor,
wherein the third substrate is disposed opposite the second substrate such that the second substrate and the third substrate define a cavity,
wherein the first substrate includes a portion extending beyond the first anchor and the second anchor and configured to flex within the cavity.

17. The device of claim 16, wherein the first anchor does not extend into any of the first substrate, the second substrate, and the third substrate, and wherein the second anchor does not extend into any of the first substrate, the second substrate, and the third substrate.

18. The device of claim 16, wherein the first anchor includes epitaxial polysilicon.

19. The device of claim 16, wherein the second anchor includes a first eutectic material disposed on the first substrate and a second eutectic material disposed on the third substrate.

20. The device of claim 16, wherein the cavity is configured to maintain a partial vacuum surrounding the portion of the first substrate.

* * * * *